United States Patent [19]

Saeki et al.

[11] 4,425,209

[45] Jan. 10, 1984

[54] PHOTOSETTING RESIN COMPOSITIONS

[75] Inventors: Keiji Saeki, Kadoma; Junji Ikeda, Ikoma; Tamotsu Wakahata, Katano, all of Japan

[73] Assignee: Matsushita Electric Industrial Co., Ltd., Osaka, Japan

[21] Appl. No.: 420,862

[22] Filed: Sep. 21, 1982

Related U.S. Application Data

[63] Continuation of Ser. No. 205,011, Nov. 7, 1980, abandoned.

[30] Foreign Application Priority Data

Nov. 21, 1979 [JP] Japan ................................ 54-151214

[51] Int. Cl.$^3$ .............................................. C08F 2/46
[52] U.S. Cl. ......................... 204/159.23; 204/159.15; 526/323.1; 526/323.2
[58] Field of Search ..................... 526/323.2, 323.1; 204/159.14, 159.22, 159.23, 159.16, 159.15

[56] References Cited

U.S. PATENT DOCUMENTS

| | | | |
|---|---|---|---|
| 3,785,849 | 1/1974 | Parker et al. ....................... | 526/320 |
| 3,989,610 | 11/1976 | Tsukada .......................... | 204/159.23 |
| 4,014,771 | 3/1977 | Rosenkranz .................... | 204/159.23 |
| 4,056,453 | 11/1977 | Barzywski ...................... | 204/159.23 |
| 4,169,732 | 10/1979 | Shipley .......................... | 204/159.15 |
| 4,273,802 | 6/1981 | Kamada et al. ................ | 204/159.16 |

OTHER PUBLICATIONS

Chem. Abst. 84:6651u, Yoshihara et al., Jul. 3, 1975.

*Primary Examiner*—Theodore Morris
*Attorney, Agent, or Firm*—Burgess, Ryan & Wayne

[57] ABSTRACT

A photosetting resin composition containing more than 10% by weight of one or more resins each having more than 3 functional groups—acryloyl or methacryloyl radicals—and a sensitizer. Since the compositions contain more than 10% by weight of one or more resins each having more than three functional groups, they exhibit very satisfactory and well balanced resistance-to-solder (JISC-6481, 260° C., 10 sec), flexural strength (JISP-8115, 0.38R, 180° bending) and adhesion (JISD-0202, chequer pattern test).

2 Claims, No Drawings

PHOTOSETTING RESIN COMPOSITIONS

This is a continuation, of application Ser. No. 205,011, filed Nov. 7, 1980 abandoned.

BACKGROUND OF THE INVENTION

The present invention relates to photosetting resin compositions whose principal components are photopolymerizable unsaturated compositions used in the fabrication of printed circuit boards, high-precision metal parts and so on and which may be used as the solder resist ink or the like which is set with ultraviolet radiation after having been applied so as to form a protective coating.

In the fabrication of printed circuit boards, the solder resist ink has been used in order to provide the permanent protection for printed circuits and to prevent solder from being bridged. It follows, therefore, that the qualities of the solder resist ink determine those of the printed circuit boards.

The principal components of the conventional solder resist ink are epoxy resins, melamine resins, urea resins, alkyd resins and their denatured compositions. After being uniformly applied through a screen, the solid ink is set thermally so that hard protective coatings may be formed.

With the conventional solder resist ink, the setting time is from 10 to 20 minutes so that productivity is not satisfactory. In addition, since the solder resist ink contains organic solvents, the atmospheric pollution problems arise. That is, the operators are annoyed with odors of solvents themselves in the printing step and formalin odors due to the formation of formaldehyde in the setting step.

The solder resist ink contains 60 to 80% of nonvolatile matter so that it must be applied relatively thick in order to obtain a desired degree of resistance-to-chemical, heat resistance, electrical characteristics and so on. As a result, the solder resist ink can be applied only with a lesser degree of dimensional accuracy. Furthermore, when the printed circuit boards applied with the solder resist ink are subjected to heating, some properties of the boards are lost. In addition, before the boards are transferred to the next step, they must be cooled. Thus, workability and productivity are substantially reduced.

In order to overcome the above-described problems, there have been proposed various solder resist inks whose principal components are monomers and prepolymers having radical reactive unsaturated double bonds and a photo-polymerization initiator. These inks are advantageous in that they can be set quickly with the radiation of ultraviolet radiations and are safe because they do not contain any solvents. They have been used in the fabrication of rigid boards.

However, the solder resist ink of the type described above may have satisfactory resistance-to-solder but has poor flexural strength. Some solder resist inks have satisfactory flexural strength, but are unsatisfactory in resistance-to-solder, so that such ink cannot be used in the fabrication of flexible printed circuit boards. The flexible printed circuit boards are flexible and thin so that their thermal capacity is low. Therefore, the solder resist ink used in the fabrication of flexible printed circuit boards must have excellent resistance-to-solder, adhesion to copper and polyimide, polyester or epoxy films and a high flexural strength. The flexible printed circuit boards are featured in that they are light in weight, thin and flexible. As a result, they are advantageous in (1) that the effective use of the space in an equipment is possible for wiring layouts, (2) that new circuit components can be designed by making use of the flexibility of the printed circuit boards and (3) that the fabrication and assemblying steps can be simplified so that fabrication costs can be lowered. Therefore, it is expected that the flexible printed circuit boards are increasingly used in a variety of fields. However, the solder resist ink which can be satisfactorily used in the fabrication of such flexible printed circuit boards has not been proposed yet.

DETAILED DESCRIPTION OF THE INVENTION

The present invention has for its object to provide photosetting solder resist ink compositions which can substantially overcome the above-described problems and are excellent in thermal resistance and flexural strength and, therefore, are best for use in fabrication of flexible printed circuit boards or the like.

A photosetting resin composition in accordance with the present invention contains more than 10% by weight of a resin whose molecule contains more than three functional groups—acryloyl or methacryloyl radicals—and a sensitizer. Since the resin has more than three functional groups per molecule, it is well balanced in resistance-to-solder (JISC-6481, at 260° C. for ten seconds), flexural strength (JISP-8115, 0.38R, bending through 180°) and adhesion (JISD-0202, chequer pattern tests).

The compositions which have more than three acryloyl or methacryloyl radicals per molecule are photopolymerizable monomers and oligomers such as trimethylolpropanetriacrylate, pentaerythritol-triacrylate, epoxyacrylate, melamineacrylate and so on.

The sensitizers are benzoin, benzoinalkylether, anthraquinone, benzil, benzophenone and so on and they are used alone or in combination with each other.

According to the present invention, a composition which has more than three acryloyl or methacryloyl radicals, a sensitizer, fillers which are used in photosetting paint or ink, pigments, a thixotropic agent, and a stabilizer are uniformly dispersed so that properties of the coating can be improved and suitable printability can be attained.

The photosetting resin compositions in accordance with the present invention can be set also with a conventional light source which is used in setting conventional photosetting compositions. They are, for instance, ultra-high-pressure mercury lamps, high-pressure mercury lamps, low-pressure mercury lamps, metal-halide lamps, xenon lamps, chemical lamps and so on.

Next, the present invention will be described more specifically in conjunction with EXAMPLES (from 1 to 11).

EXAMPLES 1 through 5 used as the bridge-polymerizable unsaturated compositions having methacryloyl radicals 3-functional epoxyacrylate, 2-functional esteracrylate and 2-hydroxyethyl-methacrylate. They were further added with a sensitizer, a filler and a coloring agent and uniformly mixed, whereby solder-resist ink was prepared. The ink was printed through a screen plate of from 250 to 300 mesh on a flexible printed circuit board made of polyimide. The board was radiated for 15 seconds with a high-pressure mercury lamp of 80 W/cm so that the protective coating was set. Thereafter, the printed circuit board was subjected to the tests for evaluating resistance-to-solder, flexural strength and adhesion.

EXAMPLES 1 and 2 were unsatisfactory in all of resistance-to-solder, flexural strength and adhesion. EXAMPLE 3 was satisfactory in flexural strength and adhesion, but unsatisfactory in resistance-to-solder. EXAMPLES 4 and 5 which contains more than 10% by weight of 3-functional epoxyacrylate were well balanced in resistance-to-solder, flexural strength and adhesion, which were all satisfactory.

EXAMPLES 6 through 8 followed the procedure of EXAMPLES 1 through 5, but the compositions were prepared to contain more than 10% by weight of 5-functional epoxyacrylate and trimethylolpropanetriacrylate which are compositions each containing more than three acryloyl or methacryloyl radicals per molecule. They were all satisfactory in resistance-to-solder, flexural strength and adhesion which were all well balanced.

EXAMPLES 9 through 11 also followed the procedure of EXAMPLES 1 through 5. It was found out that when the solder resist contains more than 10% by weight of a 2-functional epoxyacrylate, it is satisfactory in flexural strength and adhesion but unsatisfactory in resistance-to-solder.

As described above, EXAMPLES 4, 5, 6, 7 and 8; that is, the solder resists containing more than 10% by weight of resins each containing more than 3 functional groups—methacryloyl or acryloyl groups—per molecule, are very satisfactory in resistance-to-solder, flexural strength and adhesion. The solder resists with the above compositions have suitable printability and can be satisfactorily used as the solder resist ink in the fabrication of various flexible printed circuit boards. So far, the present invention has been described in conjunction with the solder resist ink used in the fabrication of printed circuit boards, but it will be understood that since the photosetting compositions of the present invention have satisfactory resistance-to-solder, flexural strength and adhesion which are well balanced, they can be obviously used as photosetting adhesives, molding agents, paint, printing plates and so on. It is to be understood that the present invention is not limited to the above-described examples.

EXAMPLES 1 THROUGH 5

| Com-positions | EXAMPLES | | | | |
|---|---|---|---|---|---|
| | 1 % by weight | 2 % by weight | 3 % by weight | 4 % by weight | 5 % by weight |
| 3-functional epoxyacrylate | 3 | 6 | 9 | 10 | 12 |
| 2-functional esteracrylate | 3 | 6 | 9 | 10 | 12 |
| 2-hydroxyethyl-methacrylate | 56 | 50 | 44 | 42 | 38 |
| 2-ethyl-anthraquinone | 1 | 1 | 1 | 1 | 1 |
| Modaflow | 1 | 1 | 1 | 1 | 1 |
| Talc | 33 | 33 | 33 | 33 | 33 |
| Aerogel | 2 | 2 | 2 | 2 | 2 |
| Phthalocyanine green | 1 | 1 | 1 | 1 | 1 |
| Resistance-to-solder (JISC-6481, 260° C., 10 sec.) | X | X | X | O | O |
| Flexural strength (JISP-8115, 0.38R, bending through 180°) | X | X | O | O | O |
| Adhesion (JISD-0202, chequer pattern test) | X | X | O. | O | O |

O: satisfactory
X: swelling and/or separation

EXAMPLES 6 THROUGH 8

| Com-positions | EXAMPLES | | |
|---|---|---|---|
| | 6 % by weight | 7 % by weight | 8 % by weight |
| 5-functional epoxyacrylate | 5 | 10 | 15 |
| 3-functional trimethylol-propane-triacrylate | 5 | 5 | 5 |
| 2-functional esteracrylate | 10 | 10 | 10 |
| 2-hydroxyethyl-methacrylate | 42 | 37 | 32 |
| 2-ethyl-anthraquinone | 1 | 1 | 1 |
| Modaflow | 1 | 1 | 1 |
| Talc | 33 | 33 | 33 |
| Aerogel | 2 | 2 | 2 |
| Phthalocyanine green | 1 | 1 | 1 |
| Resistance-to-solder (JISC-6481, 260° C., 10 sec.) | O | O | O |
| Flexural strength (JISP-8115, 0.38R, bending through 180°) | O | O | O |
| Adhesion (JISD-0202, chequer pattern test) | O | O | O |

O: satisfactory

EXAMPLES 9 THROUGH 11

| Com-positions | EXAMPLES | | |
|---|---|---|---|
| | 9 % by weight | 10 % by weight | 11 % by weight |
| 2-functional epoxyacrylate | 10 | 20 | 30 |
| 2-functional esteracrylate | 10 | 20 | 30 |
| 2-hydroxyethyl-methacrylate | 42 | 22 | 2 |
| 2-ethyl-anthraquinone | 1 | 1 | 1 |
| Modaflow | 1 | 1 | 1 |
| Talc | 33 | 33 | 33 |
| Aerogel | 2 | 2 | 2 |
| Phthalocyanine green | 1 | 1 | 1 |
| Resistance-to-solder (JISC-6481, 260° C., 10 sec.) | X | X | X |
| Flexural strength (JISP-8115, | O | O | O |

-continued

| Compositions | EXAMPLES | | |
|---|---|---|---|
| | 9 % by weight | 10 % by weight | 11 % by weight |
| (JISP-8115, 0.38R, bending through 180°) | | | |
| Adhesion (JISD-0202, chequer pattern test) | O | O | O |

O: satisfactory
X: swelling and/or separation

What is claimed is:

1. A photocurable solder resist for use with flexible printed circuit boards comprising from 10 to 20% by weight of a resin selected from the group consisting of epoxy (metha) acrylate and trimethylol propane triacrylate having at least three groups per molecule selected from acryloyl and methacryloyl groups, from 10 to 12% by weight of an ester (metha) acrylate having two groups per molecule selected from acryloyl and methacryloyl groups, and 32 to 42% by weight of 2-hydroxyethyl methacrylate and a sensitizer.

2. A photocurable solder resist as claimed in claim 1, wherein said resin having at least three groups per molecule selected from acryloyl and methacryloyl groups is selected from epoxyacrylate, trimethylolpropane triacrylate and mixtures thereof.

* * * * *